United States Patent
Kim et al.

(10) Patent No.: US 9,159,874 B2
(45) Date of Patent: Oct. 13, 2015

(54) LIGHT EMITTING DIODE AND METHOD OF MANUFACTURING THE SAME

(71) Applicant: Samsung Display Co. Ltd., Yongin, Gyeonggi-Do (KR)

(72) Inventors: Young Chun Kim, Seoul (KR); Myeong Ju Shin, Seoul (KR); Jung Hoon Shin, Seongnam-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/228,491

(22) Filed: Mar. 28, 2014

(65) Prior Publication Data

US 2015/0171269 A1    Jun. 18, 2015

(30) Foreign Application Priority Data

Dec. 16, 2013  (KR) .................. 10-2013-0156478

(51) Int. Cl.
*H01L 27/15* (2006.01)
*H01L 29/16* (2006.01)
*H01L 31/0328* (2006.01)
*H01L 27/14* (2006.01)
*H01L 21/00* (2006.01)
*H01L 33/08* (2010.01)
*H01L 33/06* (2010.01)
*H01L 33/00* (2010.01)
*H01L 33/60* (2010.01)

(52) U.S. Cl.
CPC ............. *H01L 33/08* (2013.01); *H01L 33/005* (2013.01); *H01L 33/06* (2013.01); *H01L 33/60* (2013.01)

(58) Field of Classification Search
CPC ........ B82Y 20/00; B82Y 10/00; H01L 33/06; H01L 33/0075; H01L 33/0079; H01L 33/32; H01L 33/54; H01L 33/62; H01L 27/15; H01L 21/8252; H01L 2924/01079
USPC ............... 257/79–82, 99, 103, 184, 431, 618; 438/22–27, 29, 37, 45–47
See application file for complete search history.

(56) References Cited

U.S. PATENT DOCUMENTS

| | | | |
|---|---|---|---|
| 6,697,403 | B2 | 2/2004 | Lee et al. |
| 6,993,055 | B2 | 1/2006 | Wang et al. |
| 7,560,736 | B2 | 7/2009 | Nelson |
| 7,825,006 | B2 | 11/2010 | Nakamura et al. |
| 8,431,944 | B2 | 4/2013 | Kim |
| 2007/0121693 | A1* | 5/2007 | Nakatsuka et al. ......... 372/43.01 |
| 2013/0126914 | A1* | 5/2013 | Pan et al. ......................... 257/88 |

FOREIGN PATENT DOCUMENTS

| | | |
|---|---|---|
| JP | 2000-174329 A | 6/2000 |
| JP | 2007-059418 A | 3/2007 |

(Continued)

*Primary Examiner* — Hsien Ming Lee
(74) *Attorney, Agent, or Firm* — Cantor Colburn LLP

(57) ABSTRACT

A light emitting diode includes a conductive substrate and a light emitting structure which includes a first semiconductor layer disposed on the conductive substrate, an active layer disposed on the first semiconductor layer, and a second semiconductor layer disposed on the active layer, a semi-transmissive layer which is disposed on the light emitting structure, and a hole which is defined in the light-emitting structure, and filled with a light emitting material which emits light having a color different from a color of light emitted from the active layer.

20 Claims, 17 Drawing Sheets

(56) References Cited

FOREIGN PATENT DOCUMENTS

| JP | 2008-277651 A | 11/2008 |
| JP | 2008-283092 A | 11/2008 |
| KR | 1020070029223 A | 3/2007 |
| KR | 1020110112221 A | 10/2011 |
| KR | 1020120059058 A | 6/2012 |
| KR | 1020120077600 A | 7/2012 |
| KR | 1020120083829 A | 7/2012 |

* cited by examiner

LIGHT EMITTING DIODE AND METHOD OF MANUFACTURING THE SAME

This application claims priority to Korean Patent Application No. 10-2013-0156478, filed on Dec. 16, 2013, and all the benefits accruing therefrom under 35 U.S.C. §119, the disclosure of which is incorporated herein by reference in its entirety.

BACKGROUND

1. Field

The invention relates to a light emitting diode ("LED") and a method of manufacturing the same.

2. Description of the Related Art

Liquid crystal displays ("LCDs") are one of the most widely used types of flat panel displays ("FPDs"). Generally, an LCD includes two substrates having electrodes and a liquid crystal layer interposed between the two substrates. In an LCD, voltages are applied to electrodes to rearrange liquid crystal molecules of a liquid crystal layer, thereby controlling the amount of light that passes through the liquid crystal layer.

Being a passive light-emitting device, an LCD requires a backlight assembly which provides light that is to pass through a liquid crystal layer. Examples of a light source used in the backlight assembly may include a cold cathode fluorescent lamp ("CCFL"), an external electrode fluorescent lamp ("EEFL"), and a light-emitting diode ("LED"). Currently, there is a growing demand for backlight assemblies using high-luminance LEDs.

An LED is generally used in the form of an LED package. An LED chip which emits blue light is mounted on a mold frame, for example. Then, a top surface of the mounted LED chip is coated with red and green phosphors, thereby producing an LED package which emits white light.

SUMMARY

Since a light-emitting diode ("LED") package includes not only an LED chip but also a mold frame and a phosphor, the LED package is thick. Accordingly, there are limitations of a space in which the LED package can be mounted. In other words, it is difficult to apply the thick LED package to an edge-type backlight assembly used in a display device having a narrow bezel and a direct-type backlight assembly used in a slim display device. In the LED package, light emitted from the LED chip is converted by phosphors. Thus, the LED package has poor color reproducibility.

Exemplary embodiments of the invention provide a thin LED having high color reproducibility.

Exemplary embodiments of the invention also provide a method of manufacturing a thin LED having high color reproducibility.

However, exemplary embodiments of the invention are not restricted to the one set forth herein. The above and other exemplary embodiments of the invention will become more apparent to one of ordinary skill in the art to which the invention pertains by referencing the detailed description of the invention given below.

According to an exemplary embodiment of the invention, there is provided an LED including a conductive substrate, a light emitting structure which includes a first semiconductor layer disposed on the conductive substrate, an active layer disposed on the first semiconductor layer, and a second semiconductor layer disposed on the active layer, and a semi-transmissive layer which is disposed on the light emitting structure, a hole which is defined in the light-emitting structure and filled with at least one light emitting material which emits light of a color different from a color of light emitted from the active layer.

In an exemplary embodiment, the LED may further includes a conductive adhesive layer which is interposed between the conductive substrate and the light emitting structure and includes a reflective material.

In an exemplary embodiment, the semi-transmissive layer may include a distributed Bragg reflector ("DBR") layer.

In an exemplary embodiment, the first semiconductor layer may include a p-type nitride semiconductor, and the second semiconductor layer may include an n-type nitride semiconductor.

In an exemplary embodiment, the light emitting material may include two or more types of quantum dots having different sizes.

In an exemplary embodiment, the LED may further include a plurality of light emitting materials which includes a first light emitting material and a second light emitting material which emit light of different colors.

In an exemplary embodiment, a thickness of the light emitting structure may be equal to a resonant length of at least one of light emitted from the active layer, light emitted from the first light emitting material, and light emitted from the second light emitting material.

In an exemplary embodiment, the active layer may emit blue light, the first light emitting material may emit red light, and the second light emitting material may emit green light.

In an exemplary embodiment, the hole may be filled with a combination of the first light emitting material and the second light emitting material.

In an exemplary embodiment, a plurality of holes may be defined in the light-emitting structure, and each of the holes may be filled with any one of the first light emitting material and the second light emitting material.

In an exemplary embodiment, the plurality of holes may be arranged in a matrix in a plan view, where holes filled with the first light emitting material and holes filled with the second light emitting material may be arranged alternately in row and column directions.

In an exemplary embodiment, the LED may further include a first electrode which is disposed directly under the conductive substrate, and a second electrode which is disposed directly on the second semiconductor layer, where the second electrode may be disposed on a central portion of a surface of the second semiconductor layer, and the hole may surround the second electrode in a plan view.

In an exemplary embodiment, the light emitting structure may include at least one protrusion, and the hole may be defined in the protrusion.

In an exemplary embodiment, the LED may further include a plurality of protrusions including a first protrusion and a second protrusion having different heights, a plurality of holes including a first hole included in the first protrusion and a second hole included in the second protrusion, and a plurality of light emitting materials including a first light emitting material and a second light emitting material which emit light of different colors from each other, where the first hole may be filled with any one of the first light emitting material and the second light emitting material, and the second hole may be filled with the other one of the first light emitting material and the second light emitting material.

According to another exemplary embodiment of the invention, there is provided an LED including a reflective layer, a light emitting structure which includes a first semiconductor layer disposed on the reflective layer, an active layer disposed on the first semiconductor layer, and a second semiconductor layer disposed on the active layer, and a DBR layer disposed on the light emitting structure, where the light-emitting structure includes at least one hole filled with a first light emitting material and a second light emitting material, and the active layer, the first light emitting material, and the second light emitting material emit light of different colors.

In an exemplary embodiment, a thickness of the light emitting structure may equal to a resonant length of at least one of light emitted from the active layer, light emitted from the first light emitting material, and light emitted from the second light emitting material.

In an exemplary embodiment, the active layer may emit blue light, the first light emitting material may emit red light, and the second light emitting material may emit green light.

According to still another exemplary embodiment of the invention, there is provided a method of manufacturing an LED, the method including preparing a light emitting structure which includes a first semiconductor layer, an active layer and a second semiconductor layer stacked sequentially on a conductive substrate and defining a plurality of holes exposing inner side surfaces of at least one of the first semiconductor layer, the active layer and the second semiconductor layer, filling the plurality of holes with a light emitting material, and providing a DBR layer on the holes.

In an exemplary embodiment, the preparing of the light emitting structure includes providing a preliminary light emitting structure on a sapphire substrate, bonding the preliminary light emitting structure and the conductive substrate with a conductive adhesive layer, exposing a surface of the preliminary light emitting structure by separating the sapphire substrate from the preliminary light emitting structure, and converting the preliminary light emitting structure into the light emitting structure by etching the exposed surface of the preliminary light emitting structure.

The filling of the holes with the light emitting material may include injecting a first light emitting material which emits red light and a second light emitting material which emits green light into the holes.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
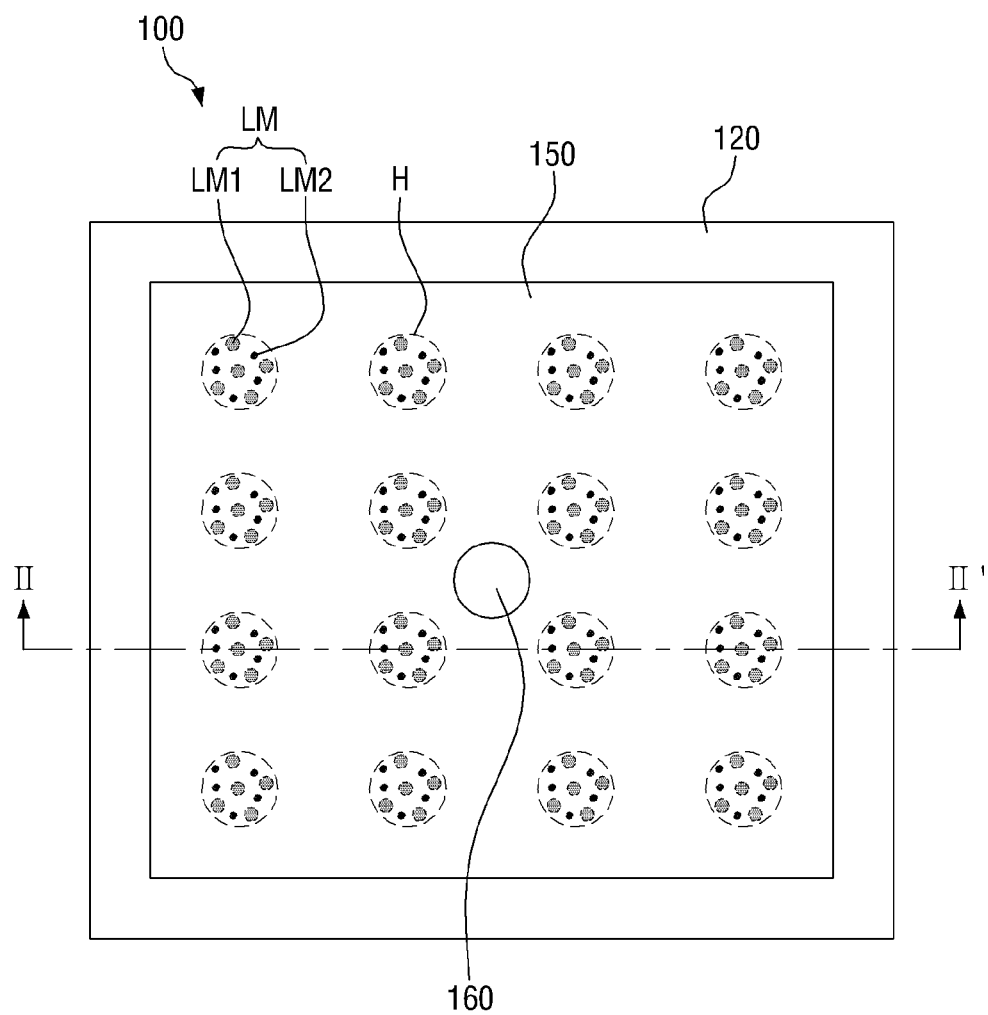
FIG. 1 is a plan view of an embodiment of a light emitting diode ("LED") according to the invention.

The exemplary embodiments and features of the invention and methods for achieving the exemplary embodiments and features will be apparent by referring to the embodiments to be described in detail with reference to the accompanying drawings. However, the invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described with reference to the attached drawings.

Figure 2:
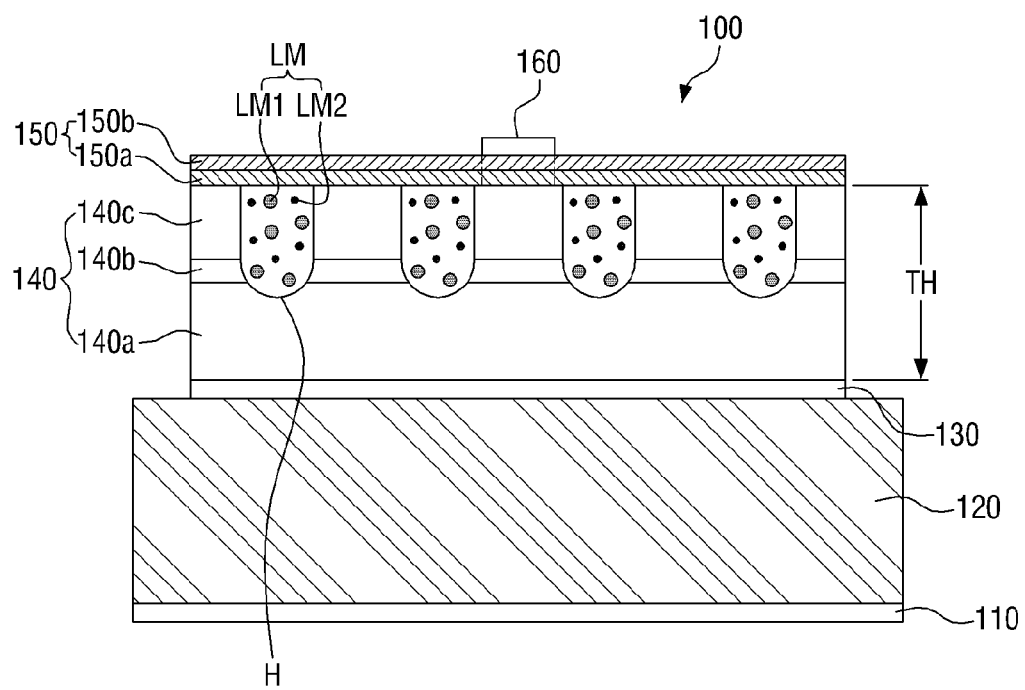
FIG. 2 is a cross-sectional view taken along line II-II' of FIG. 1.

FIG. 1 is a plan view of a light emitting diode ("LED") 100 according to an exemplary embodiment of the invention. FIG. 2 is a cross-sectional view taken along line II-II' of FIG. 1. Referring to FIGS. 1 and 2, the LED 100 according to the illustrated exemplary embodiment includes a conductive substrate 120, a light emitting structure 140, and a semi-transmissive layer 150. In addition, the LED 100 according to the illustrated exemplary embodiment may further include a conductive adhesive layer 130, a first electrode 110, and a second electrode 160.

The conductive substrate 120 may support the light emitting structure 140. In an exemplary embodiment, the conductive substrate 120 may serve as an electrode. In an exemplary embodiment, the conductive substrate 120 may be shaped like a rectangular parallelepiped plate, for example. However, the shape of the conductive substrate 120 is not limited to the rectangular parallelepiped plate and may vary according to the shape of the light emitting structure 140. In an exemplary embodiment, the conductive substrate 120 may include silicon. However, the material of the conductive substrate 120 is not limited to silicon, and the conductive substrate 120 may also include a metallic material with high conductivity.

The light emitting structure 140 may be disposed on a surface of the conductive substrate 120. The light emitting structure 140 may include a material that emits light in response to power supplied thereto. The light emitting structure 140 may include a first semiconductor layer 140a, an active layer 140b, and a second semiconductor layer 140c.

The first semiconductor layer 140a may be disposed on the conductive substrate 120. In an exemplary embodiment, the first semiconductor layer 140a may include a p-type nitride semiconductor. In an exemplary embodiment, the first semiconductor layer 140a may include a semiconductor material having a composition formula of $In_xAl_yGa_{1-x-y}N$ ($0 \leq x \leq 1$, $0 \leq y \leq 1$, $0 \leq x+y \leq 1$), such as InAlGaN, GaN, AlGaN, AlInN, InGaN, MN or InN, for example, and may be doped with p-type dopants such as Mg, Zn, Ca, Sr or Ba, for example.

The active layer 140b may be disposed on the first semiconductor layer 140a. In exemplary embodiments, the active layer 140b may include InGaN and GaN, for example, and may have at least one of a single quantum well ("SQW") structure, a multi quantum well ("MQW") structure, a quantum dot structure, and a quantum wire structure, for example. The active layer 140b may generate light using energy created by the recombination of holes and electrodes provided from the first semiconductor layer 140a and the second semiconductor layer 140c.

The second semiconductor layer 140c may be disposed on the active layer 140b. In an exemplary embodiment, the second semiconductor layer 140c may include an n-type nitride semiconductor. In an exemplary embodiment, the second semiconductor layer 140c may include a semiconductor material having a composition formula of $In_xAl_yGa_{1-x-y}N$ ($0 \leq x \leq 1$, $0 \leq y \leq 1$, $0 \leq x+y \leq 1$), such as InAlGaN, GaN, AlGaN, AlInN, InGaN, MN or InN, for example, and may be doped with n-type dopants such as Si, Ge, or Sn, for example.

The LED 100 according to the exemplary embodiment may include a vertical LED. That is, unlike a conventional LED in which an n-type semiconductor layer, an active layer, and a p-type semiconductor layer are stacked sequentially on an insulating substrate, the LED 100 according to the exemplary embodiment may have a structure in which a p-type semiconductor layer (i.e., the first semiconductor layer 140a), the active layer 140b, and an n-type semiconductor layer (i.e., the second semiconductor layer 140c) are stacked sequentially on the conductive substrate 120. Accordingly, one wire (not shown) may be connected only to an n-type electrode (i.e., the second electrode 160).

At least one hole H may be defined in the light emitting structure 140. In an exemplary embodiment, the hole H may be recessed from a top surface of the second semiconductor layer 140c. In an exemplary embodiment, the hole H may expose inner side surfaces of the first semiconductor layer 140a, the active layer 140b, and the second semiconductor layer 140c. However, the invention is not limited thereto, and the hole H may expose only the inner side surfaces of the active layer 140b and the second semiconductor layer 140c, or the inner side surfaces of the second semiconductor layer 140c only. That is, a depth of the hole H may vary.

The hole H may be provided in plural. In the exemplary embodiment of FIG. 1, sixteen holes H may be defined in the light emitting structure 140, for example. However, this is merely an exemplary embodiment, and n holes may be defined in the light emitting structure 140, where n is a natural number of two or more.

The holes H may be arranged in a matrix in a plan view. In the exemplary embodiment of FIG. 1, the holes H may be arranged in a 4×4 matrix. However, this is merely an exemplary embodiment, and the holes H may be arranged in an n×m matrix in a plan view, where one of n and m is a natural number of one or more, and the other one is a natural number of two or more. However, the arrangement of the holes H is not limited to the matrix form. That is, the holes H may be arranged in various other shapes according to the shape of the light emitting structure 140.

The holes H may be filled with at least one light emitting material LM. In an exemplary embodiment, the light emitting material LM may include a material that emits light of a color different from a color of light emitted from the active layer 140b. In an exemplary embodiment, the light emitting material LM may also emit light of multiple colors. The light emitting material LM may include a first light emitting material LM1 and a second light emitting material LM2 which emit light of different colors.

The first light emitting material LM1 may be nanophosphors or quantum dots. Here, the quantum dots may be quantum dots using a cadmium (Cd) compound, such as CdSe, for example. However, the invention is not limited thereto, and the quantum dots may also be quantum dots not using a cadmium compound, such as InP, for example. In addition, a size of quantum dots used as the first light emitting material LM1 may be larger than that of quantum dots used as the second light emitting material LM2 which will be described later. Here, the size of quantum dots may denote a volume of the quantum dots. When the quantum dots are spherical, a size of the quantum dots may denote a diameter of the quantum dots. In an exemplary embodiment, the diameter of the first light emitting material LM1 may be, but is not limited to, approximately 5 nanometers (nm) to approximately 50 nm. When the first light emitting material LM1 is quantum dots including cadmium, the diameter of the first light emitting material LM1 may be approximately 30 nm. When the first light emitting material LM1 is quantum dots without cadmium, the diameter of the first light emitting material LM1 may be approximately 45 nm. In an exemplary embodiment, the first light emitting material LM1 may emit red light, for example.

The second light emitting material LM2 may be nanophosphors or quantum dots. Here, the quantum dots may be quantum dots using a cadmium (Cd) compound, such as CdSe. However, the invention is not limited thereto, and the quantum dots may also be quantum dots not using a cadmium compound, such as InP, for example. In addition, a size of quantum dots used as the second light emitting material LM2 may be smaller than that of quantum dots used as the first light emitting material LM1. That is, the quantum dots used as the second light emitting material LM2 may include the same material as the quantum dots used as the first light emitting material LM1 but may have a different size from the size of the quantum dots used as the first light emitting material LM1. In an exemplary embodiment, the second light emitting material LM2 may emit green light, for example.

Each of the holes H may be filled with a combination of the first light emitting material LM1 and the second light emitting material LM2. In an exemplary embodiment, one hole H may be filled with the first light emitting material LM1 and the second light emitting material LM2 mixed in a ratio of 5:5. However, the invention is not limited thereto, and the first light emitting material LM1 and the second light emitting material LM2 may also be mixed in a ratio of 4:6 or 6:4, for example.

In addition to the light emitting material LM described above, a filling material such as resin may be additionally included in each of the holes H. The resin may enable the light emitting material LM to be positioned stably in each of the holes H.

The semi-transmissive layer 150 may be disposed on the light emitting structure 140. Specifically, the semi-transmissive layer 150 may be disposed on the holes H to cover the holes H. In other words, the semi-transmissive layer 150 may seal the holes H. The semi-transmissive layer 150 may reflect a portion of light emitted from the active layer 140b and the light emitting material LM, and transmit the other portion of the light.

The semi-transmissive layer 150 may include a distributed Bragg reflector ("DBR") layer. In an exemplary embodiment, the semi-transmissive layer 150 may include a first layer 150a and a second layer 150b which have different refractive indices and are stacked alternately. In an exemplary embodiment, the first layer 150a may have a smaller refractive index than the second layer 150b. Any one of the first layer 150a and the second layer 150b may include silicon oxide (SiOx), and the other one of the first layer 150a and the second layer 150b may include silicon nitride (SiNx). In an exemplary embodiment, the first layer 150a or the second layer 150b may include at least one of TiOx, HfOx, and ZrOx, for example. In the exemplary embodiment of FIG. 2, the first layer 150a and the second layer 150b are stacked. However, the invention is not limited thereto, and the first layer 150a and the second layer 150b may also be stacked alternately with three or more layers.

The conductive adhesive layer 130 may be disposed between the conductive substrate 120 and the light emitting structure 140. Specifically, the conductive adhesive layer 130 may directly contact a top surface of the conductive substrate 120 and a bottom surface of the first semiconductor layer 140a. The conductive adhesive layer 130 may include a reflective material. In an exemplary embodiment, the conductive adhesive layer 130 may include a metallic material such as silver (Ag) or gold (Au), for example. However, the invention is not limited thereto, and the conductive adhesive layer 130 may also include various other materials having reflexibility.

The first electrode 110 may be disposed directly under the conductive substrate 120. The first electrode 110 may be electrically connected to the first semiconductor layer 140a. When the first semiconductor layer 140a includes a p-type nitride semiconductor, the first electrode 110 may be a p-type electrode. In this case, the first electrode 110 may include an oxide conductive layer or a transparent metal layer such as Ni/Au.

The second electrode 160 may be disposed directly on the second semiconductor layer 140c. In an exemplary embodiment, the second electrode 160 may be disposed on a central portion of a surface of the second semiconductor layer 140c in a plan view. As shown in FIGS. 1 and 2, the second electrode 160 may be shaped like a cylinder. However, the shape of the second electrode 160 is not limited to the cylinder, and the second electrode 160 may have various other shapes. The second electrode 160 may be electrically connected to the second semiconductor layer 140c. When the second semiconductor layer 140c includes an n-type nitride semiconductor, the second electrode 160 may be an n-type electrode. In this case, the second electrode 160 may include any one material or a combination of two or more materials of Ti, Al, Pt, Pd, Au, Cr, Fe, Cu, and Mo, for example.

In the LED 100 according to the exemplary embodiment, the light emitting material LM and the light emitting structure 140 are placed between the conductive adhesive layer 130 (hereinafter, also referred to as a reflective layer) including a reflective material and the semi-transmissive layer 150. Thus, the LED 100 according to the exemplary embodiment may have a resonance structure. In the LED 100 having the resonance structure, beams of light emitted from the light emitting material LM and the active layer 140b are reflected and interfere with each other between the reflective layer and the semi-transmissive layer 150 due to a microcavity effect. Then, constructively interfered light of only a certain wavelength is radiated through the semi-transmissive layer 150. Accordingly, a half-width of the radiated light is reduced, and the reduced half-width of the radiated light improves color purity, which, in turn, improves color reproducibility.

To make the LED 100 have the resonance structure as described above, a thickness TH of the light emitting structure 140, that is, a distance between the reflective layer and the semi-transmissive layer 150 may be adjusted. That is, the thickness TH of the light emitting structure 140 may be equal to a resonant length of at least one of light emitted from the active layer 140b, light emitted from the first light emitting material LM1, and light emitted from the second light emitting material LM2.

An exemplary embodiment of the thickness TH of the light emitting structure 140 will now be described. In the exemplary embodiment, it is assumed that blue light is emitted from the active layer 140b, red light is emitted from the first light emitting material LM1, and green light is emitted from the second light emitting material LM2.

To make the LED 100 have the resonance structure, the thickness TH of the light emitting structure 140, that is, the distance between the reflective layer and the semi-transmissive layer 150 may be an integer multiple of λ/2n. Here, λ, is a wavelength of light, and n is a refractive index of a portion of the light emitting structure 140 which emits light.

The blue light emitted from the active layer 140b has a wavelength of approximately 450 nm, and portions of the light emitting structure 140 in which the holes H are not defined have an average refractive index of approximately 2.5. That is, to make the blue light emitted from the active layer 140b resonate, the thickness TH of the light emitting structure 140 may be an integer multiple of approximately 90 nm. In this case, the thickness and material of the semi-transmissive layer 150 may be adjusted such that light other than the blue light can transmit through the semi-transmissive layer 150 without being reflected by the semi-transmissive layer 150.

The red light emitted from the first light emitting material LM1 has a wavelength of approximately 600 nm, and portions of the light emitting structure 140 in which the holes H filled with the first light emitting material LM1 are defined have an average refractive index of approximately 1.5. That is, to make the red light emitted from the first light emitting material LM1 resonate, the thickness TH of the light emitting structure 140 may be an integer multiple of approximately 200 nm. In this case, the thickness and material of the semi-transmissive layer 150 may be adjusted such that light other than the red light can transmit through the semi-transmissive layer 150 without being reflected by the semi-transmissive layer 150.

The green light emitted from the second light emitting material LM2 has a wavelength of approximately 550 nm, and portions of the light emitting structure 140 in which the holes H filled with the second light emitting material LM2 are defined have an average refractive index of approximately 1.5. That is, to make the green light emitted from the second light emitting material LM2 resonate, the thickness TH of the light emitting structure 140 may be an integer multiple of approximately 180 nm. In this case, the thickness and material of the semi-transmissive layer 150 may be adjusted such that light other than the green light can transmit through the semi-transmissive layer 150 without being reflected by the semi-transmissive layer 150.

To improve the color purity of light emitted from the LED 100, the thickness TH of the light emitting structure 140 may be adjusted as described above. Here, to make the LED 100 slim, the thickness TH of the light emitting structure 140 may be designed to have a smallest resonant length. In an exemplary embodiment, to make only the blue light emitted from the active layer 140b resonate, the thickness TH of the light emitting structure 140 may be designed to be approximately 90 nm. In another exemplary embodiment, to make only the red light emitted from the first light emitting material LM1 resonate, the thickness TH of the light emitting structure 140 may be designed to be approximately 200 nm.

In addition, light of two or more colors may be made to resonate simultaneously by adjusting the thickness TH of the light emitting structure 140. In an exemplary embodiment, to make the blue light emitted from the active layer 140b and the green light emitted from the second light emitting material LM2 resonate, the thickness TH of the light emitting structure 140 may be designed to be approximately 180 nm. In another exemplary embodiment, to make the blue light emitted from the active layer 140b, the red light emitted from the first light emitting material LM1, and the green light emitted from the second light emitting material LM2 resonate, the thickness TH of the light emitting structure 140 may be designed to be approximately 1800 nm.

By adjusting the thickness TH of the light emitting structure 140 as described above, the color purity of light emitted from the active layer 140b and the light emitting material LM can be improved. That is, the color purity of at least one of the blue light, the red light and the green light can be improved. As a result, the color purity of white light generated by the combination of the blue light, the red light and the green light can also be improved.

In addition, since a mold frame and phosphors used in a general LED package are not necessary, a thickness of the LED 100 can be reduced. Accordingly, the LED 100 can be easily applied to an edge-type backlight assembly used in a display device including a narrow bezel and a direct-type backlight assembly used in a slim display device.

Also, when quantum dots are used as the light emitting material LM, color reproducibility can be improved compared with when phosphors are used as the light emitting material LM. Here, when the quantum dots used as the light emitting material LM do not include a cadmium compound, they may not cause environmental contamination.

Furthermore, since the semi-transmissive layer 150 covers the light emitting material LM, the light emitting material LM can be protected from outside moisture and oxygen, for example. Generally, quantum dots are very vulnerable to outside moisture and oxygen. However, since the semi-transmissive layer 150 including an insulating material seals the quantum dots, the quantum dots can be stably positioned in the holes H.

A method of manufacturing the LED 100 according to an exemplary embodiment of the invention will now be described with reference to FIGS. 3 through 9. FIGS. 3 through 9 are cross-sectional views illustrating operations of a method of manufacturing the LED 100 of FIG. 1. For convenience of description, elements substantially identical to those illustrated in the above-described drawings are indicated by the same reference numerals, and a detailed description thereof will be omitted.

Figure 3:
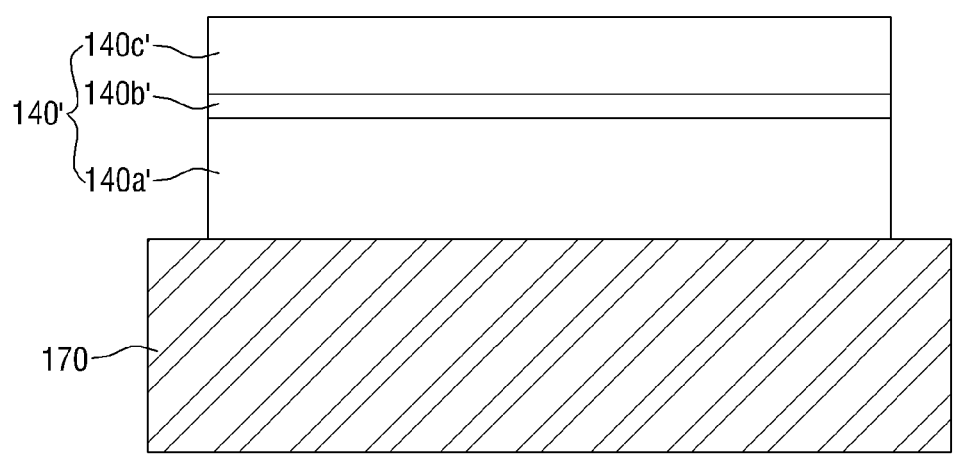
FIGS. 3 through 9 are cross-sectional views illustrating operations of a method of manufacturing the LED of FIG. 1.

Referring to FIG. 3, a preliminary light emitting structure 140' is disposed on a sapphire substrate 170. The preliminary light emitting structure 140' may be a light emitting structure 140 before holes H are defined therein. The preliminary light emitting structure 140' may have a structure in which a first preliminary semiconductor layer 140a', a preliminary active layer 140b', and a second preliminary semiconductor layer 140c' are stacked sequentially on the sapphire substrate 170. The second preliminary semiconductor layer 140c', the preliminary active layer 140b', and the first preliminary semiconductor layer 140a' may respectively be a second semiconductor layer 140c, an active layer 140b, and a first semiconductor layer 140a before being patterned. That is, the preliminary light emitting structure 140' and elements included in the preliminary light emitting structure 140' may be substantially identical to the light emitting structure 140 and elements included in the light emitting structure 140 except for their shapes.

Figure 4:
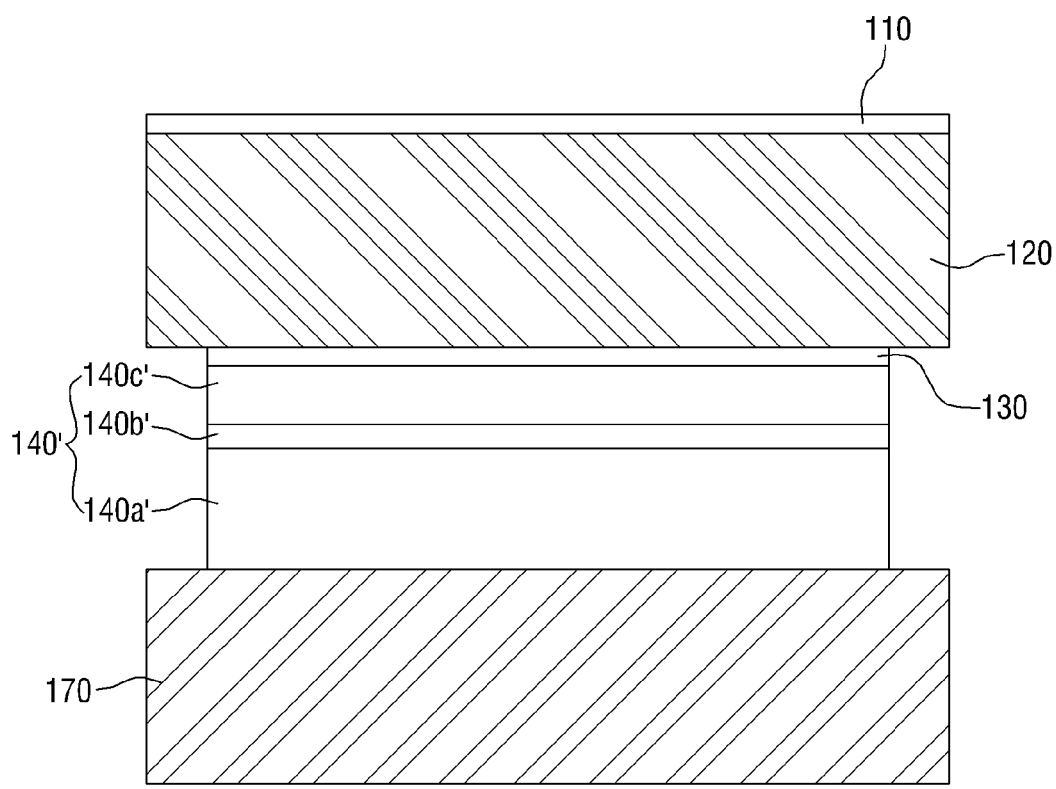

Referring to FIG. 4, a conductive substrate 120 is prepared. A conductive adhesive layer 130 is disposed on a surface of the conductive substrate 120 and a first electrode 110 is disposed on the other surface of the conductive substrate 120 that faces the surface on which the conductive adhesive layer 130 is disposed. The conductive adhesive layer 130 disposed on the other surface of the conductive substrate 120 is placed on the preliminary light emitting structure 140' such that the conductive adhesive layer 130 faces the preliminary light emitting structure 140'. Then, certain heat and pressure are applied to the conductive adhesive layer 130, thereby bonding the conductive substrate 120 and the preliminary light emitting structure 140' together.

Figure 5:
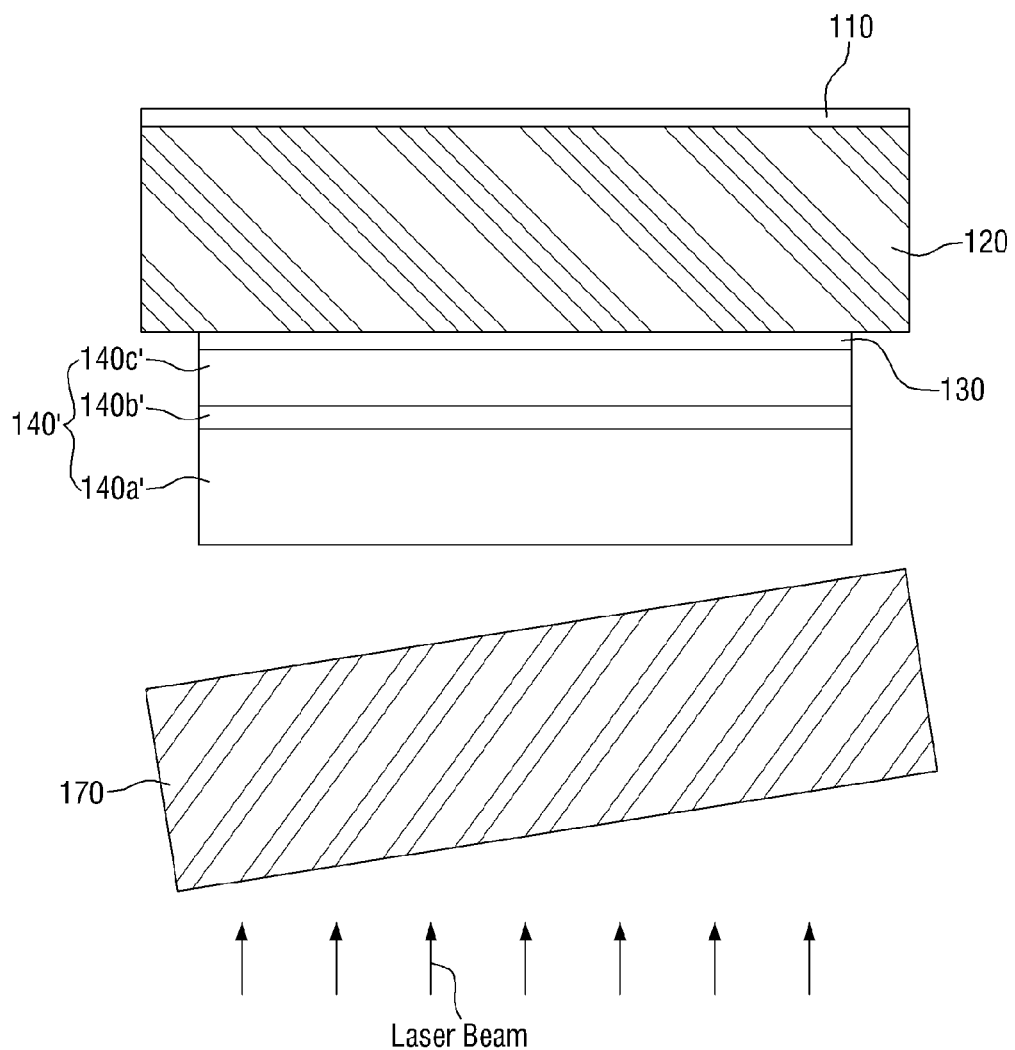

Referring to FIG. 5, the sapphire substrate 170 is separated from the preliminary light emitting structure 140' using laser beams. Here, a laser lift off ("LLO") process may be used, but the invention is not limited thereto. Accordingly, a surface of the preliminary light emitting structure 140' may be exposed. In the illustrated exemplary embodiment, a lower surface of in the preliminary light emitting structure 140a' may be exposed.

Figure 6:
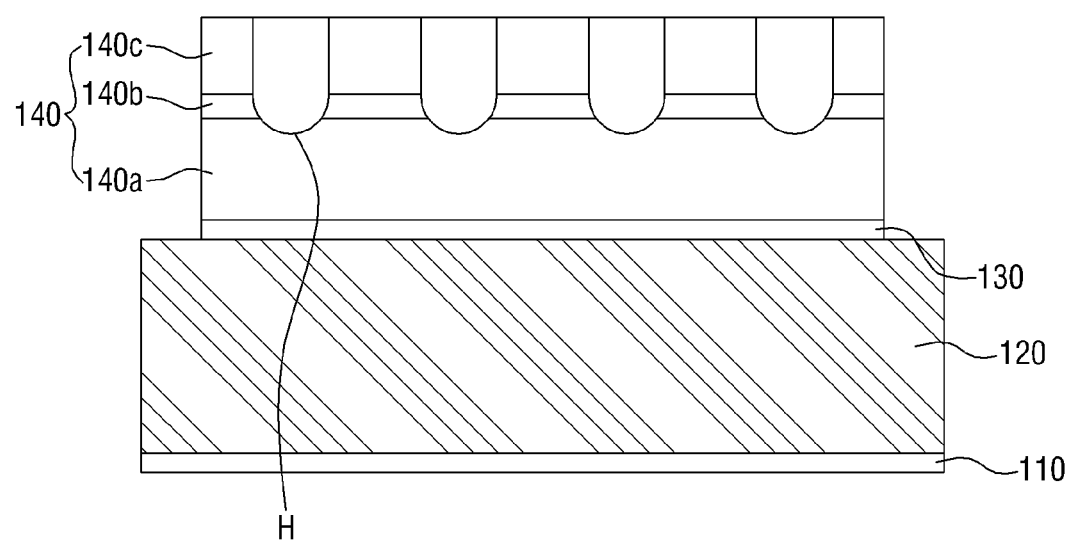

Referring to FIGS. 5 and 6, the exposed surface of the preliminary light emitting structure 140' is etched to define the holes H therein. Here, a general photoresist process may be used, but the invention is not limited thereto. In an exemplary embodiment, a depth of each of the holes H may be adjusted by controlling a degree of etching. Accordingly, the preliminary light emitting structure 140' may be converted into the light emitting structure 140 defining the holes H therein.

Figure 7:
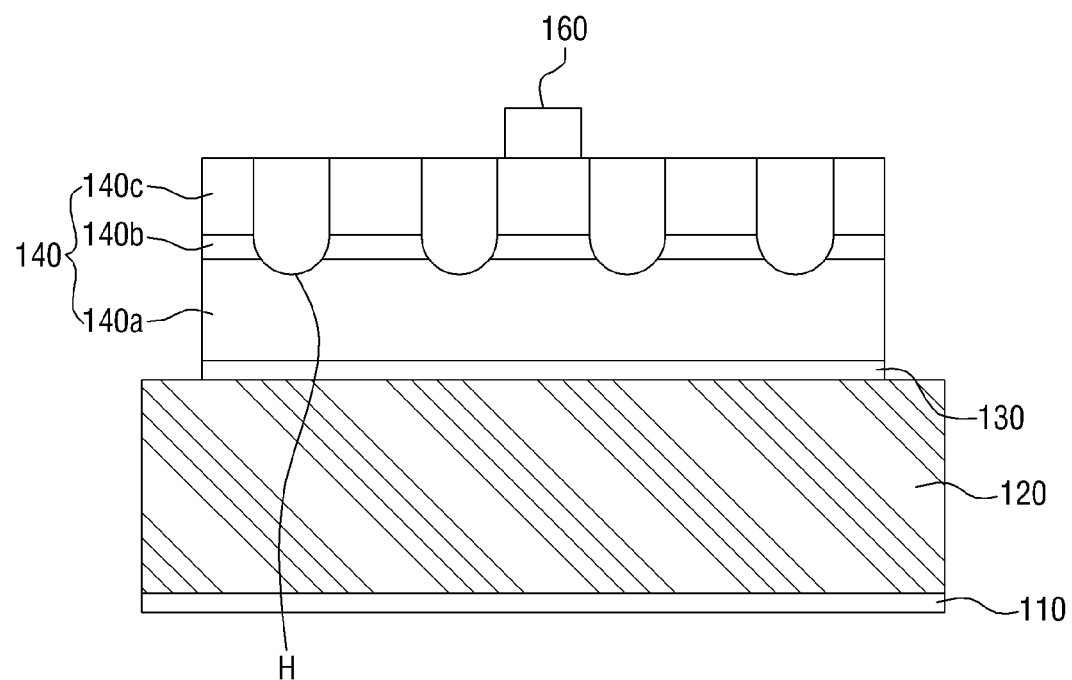

Referring to FIG. 7, a second electrode 160 is disposed on a surface of the light emitting structure 140. The second electrode 160 may be disposed on a central portion of a surface of the second semiconductor layer 140c, but the invention is not limited thereto.

Figure 8:
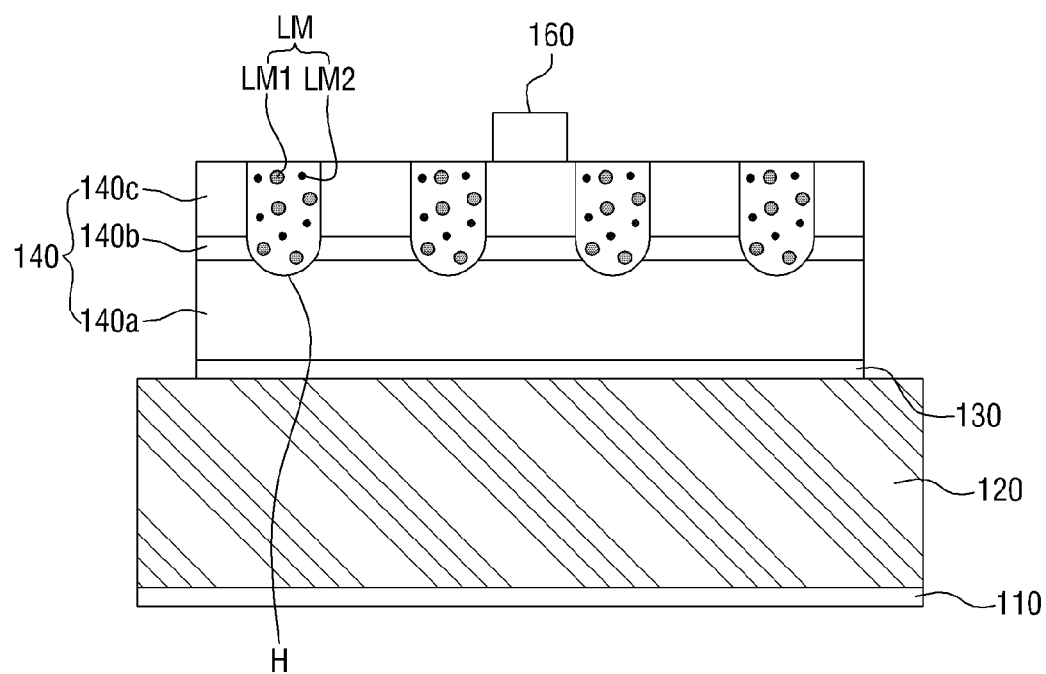

Referring to FIG. 8, the holes H are filled with a light emitting material LM. The holes H may be filled with the light emitting material LM in various ways. In an exemplary embodiment, when the light emitting material LM is nanophosphors, the holes H may be filled with the light emitting material LM using a sputtering process, for example. In another exemplary embodiment, when the light emitting material LM is quantum dots, the holes H may be filled with the light emitting material LM using a spray coating process or a screen printing process, for example.

Figure 9:
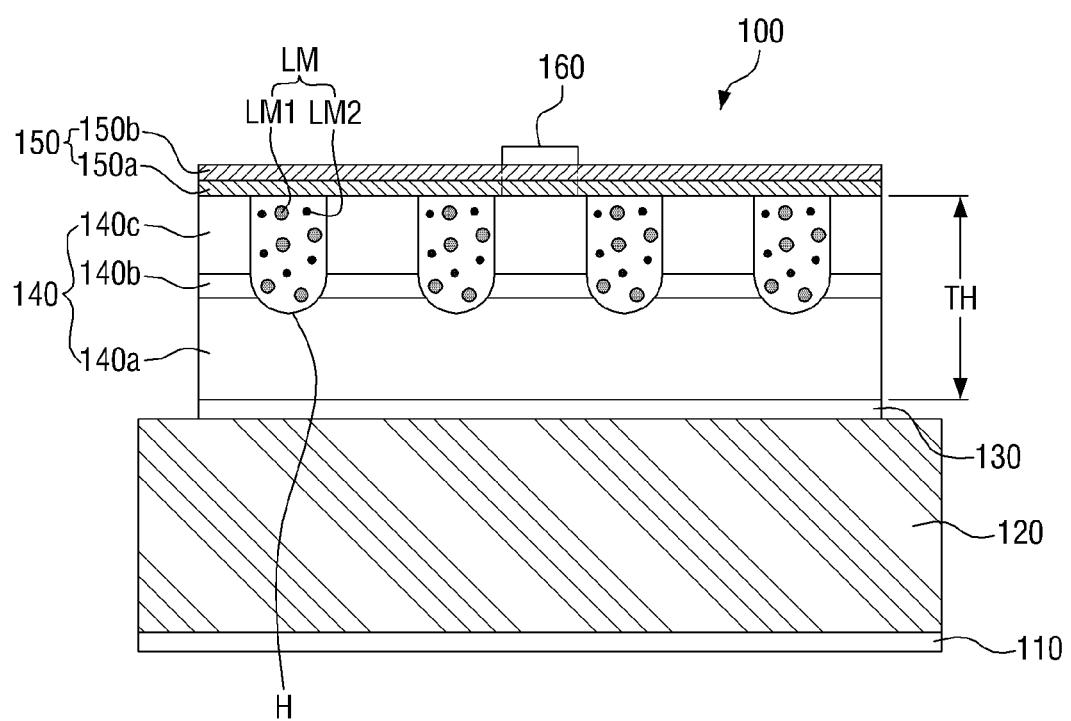

Referring to FIG. 9, a semi-transmissive layer 150 is disposed on the light emitting structure 140 and the holes H. As described above, the semi-transmissive layer 150 may be a DBR layer. The semi-transmissive layer may be disposed by a general deposition process.

Figure 10:
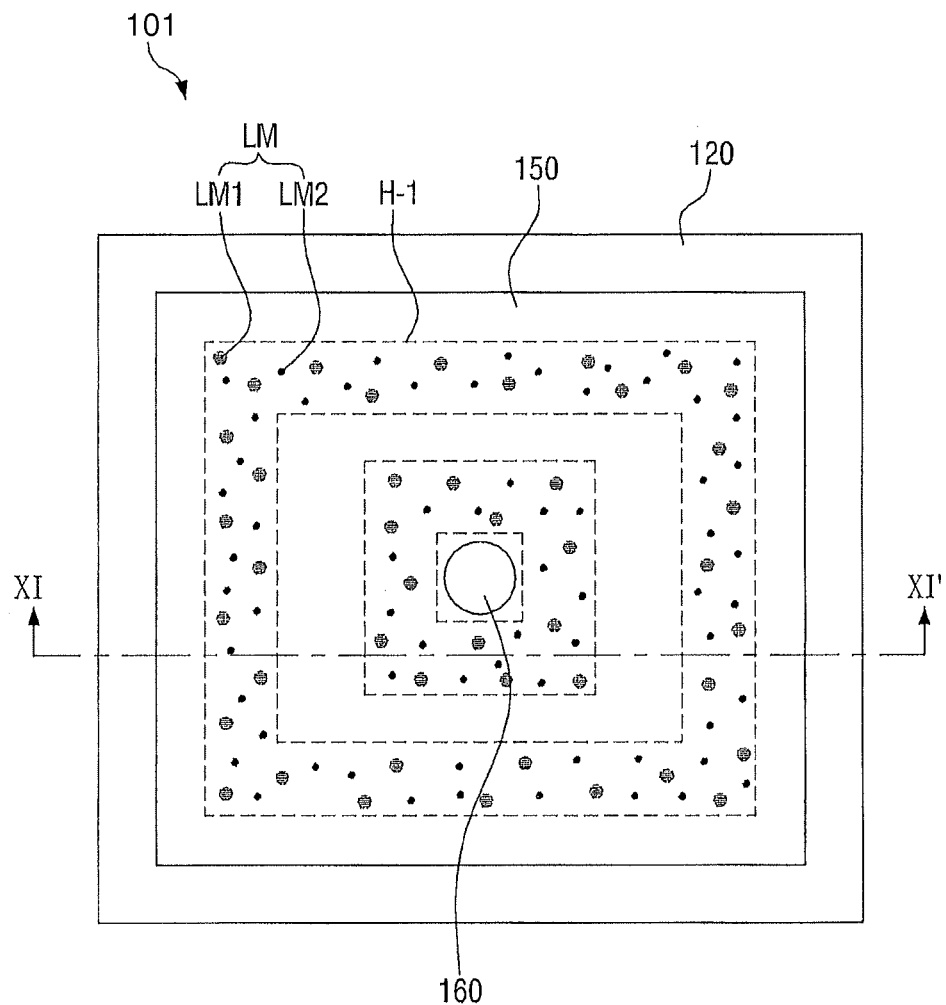
FIG. 10 is a plan view of another embodiment of an LED according to the invention.
Figure 11:
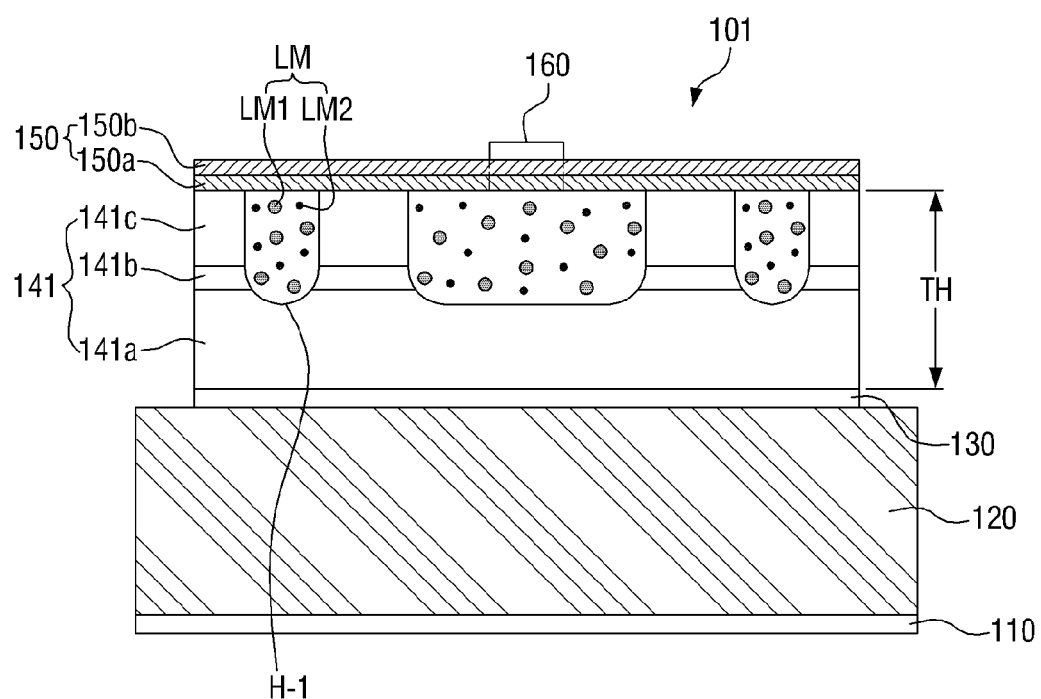
FIG. 11 is a cross-sectional view taken along line XI-XI' of FIG. 10.

FIG. 10 is a plan view of an LED 101 according to another exemplary embodiment of the invention. FIG. 11 is a cross-sectional view taken along line XI-XI' of FIG. 10. For convenience of description, elements substantially identical to those illustrated in the above-described drawings are indicated by the same reference numerals, and a detailed description thereof will be omitted.

Referring to FIGS. 10 and 11, holes H-1 may have a different shape from the holes H of the above described exemplary embodiment shown in FIGS. 1 to 9. In an exemplary embodiment, the holes H-1 may be symmetrical with respect to a second electrode 160. Specifically, the holes H-1 may surround the second electrode 160 located on a central portion of a surface of a second semiconductor layer 141c. In FIGS. 10 and 11, two holes H-1 are illustrated. However, this is merely an exemplary embodiment. Since the shape of the holes H-1 is different from the shape of the holes H of the above described exemplary embodiment, the respective shapes of a first semiconductor layer 141a, an active layer 141b, and the second semiconductor layer 141c of a light emitting structure 141 may be changed according to the shape of the holes H-1.

Figure 12:
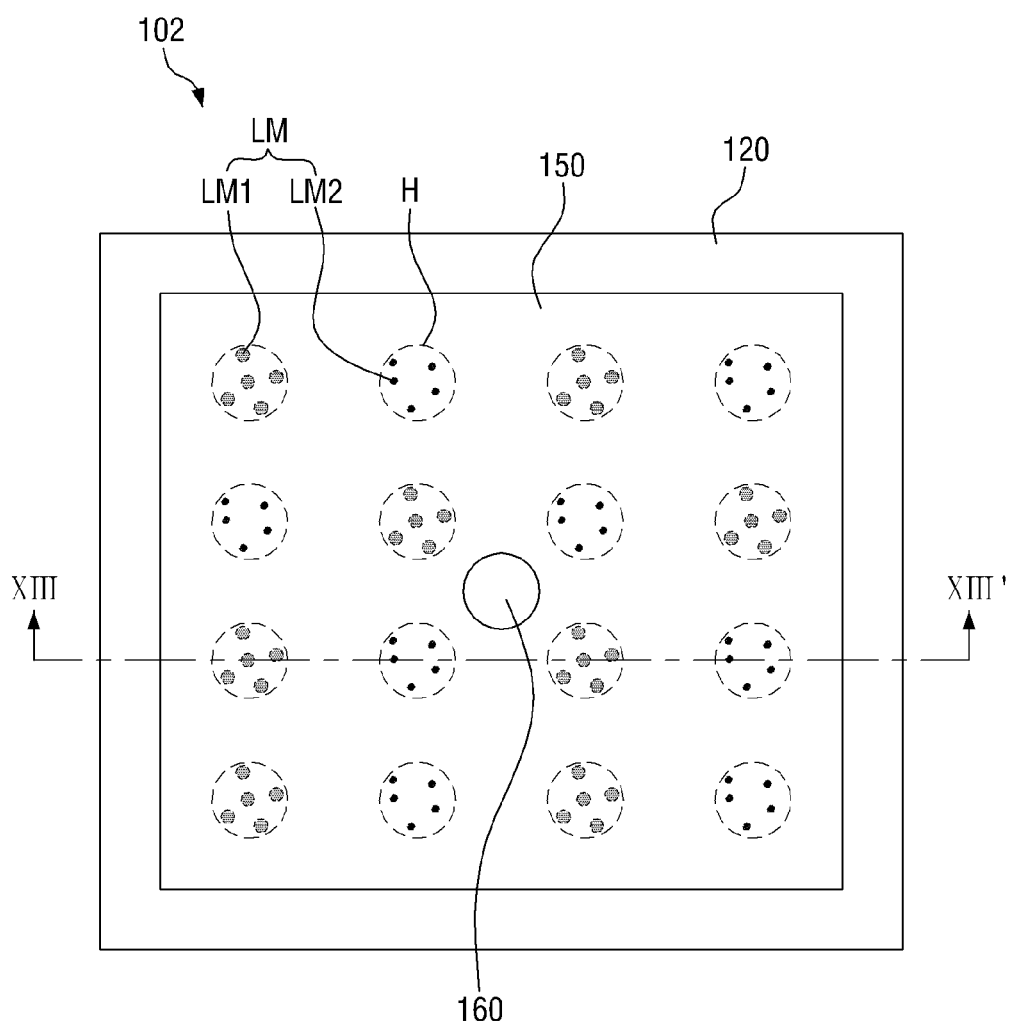
FIG. 12 is a plan view of another embodiment of an LED according to the invention.
Figure 13:
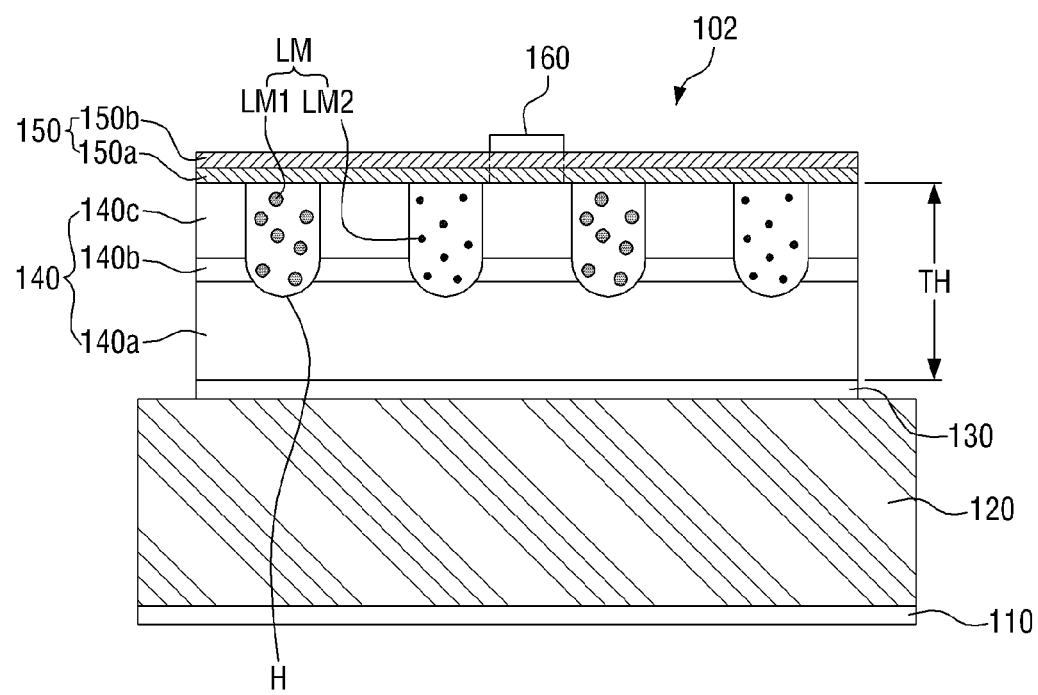
FIG. 13 is a cross-sectional view taken along line XIII-XIII' of FIG. 12.

FIG. 12 is a plan view of an LED 102 according to another exemplary embodiment of the invention. FIG. 13 is a cross-sectional view taken along line XIII-XIII' of FIG. 12. For convenience of description, elements substantially identical to those illustrated in the above-described drawings are indicated by the same reference numerals, and a detailed description thereof will be omitted.

Referring to FIGS. 12 and 13, each of a plurality of holes H may include any one of a first light emitting material LM1 and a second light emitting material LM2. In an exemplary embodiment, one hole H may include the first light emitting material LM1 only, and another hole H adjacent to the hole H may include the second light emitting material LM2 only. Specifically, holes H filled with the first light emitting material LM1 and holes H filled with the second light emitting material LM2 may be arranged alternately in row and column directions in a plan view.

Figure 14:
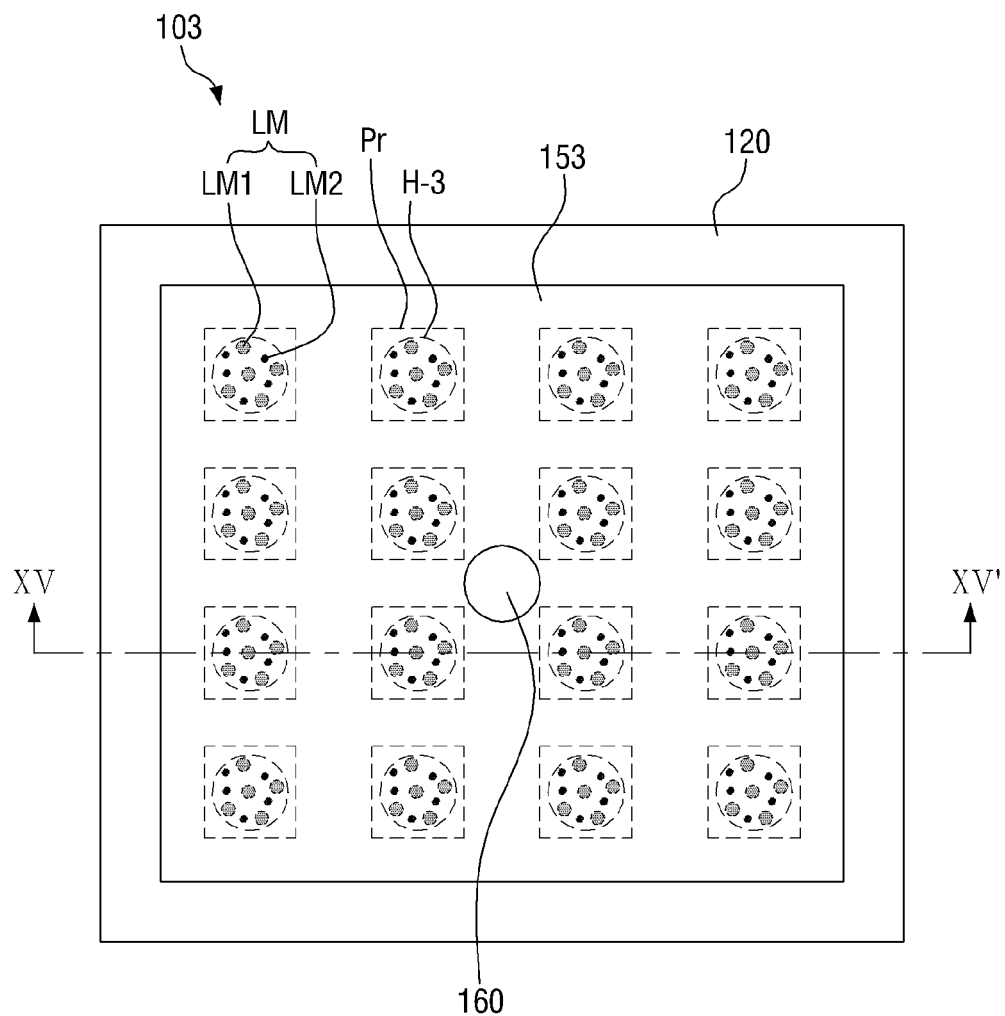
FIG. 14 is a plan view of another embodiment of an LED according to the invention.
Figure 15:
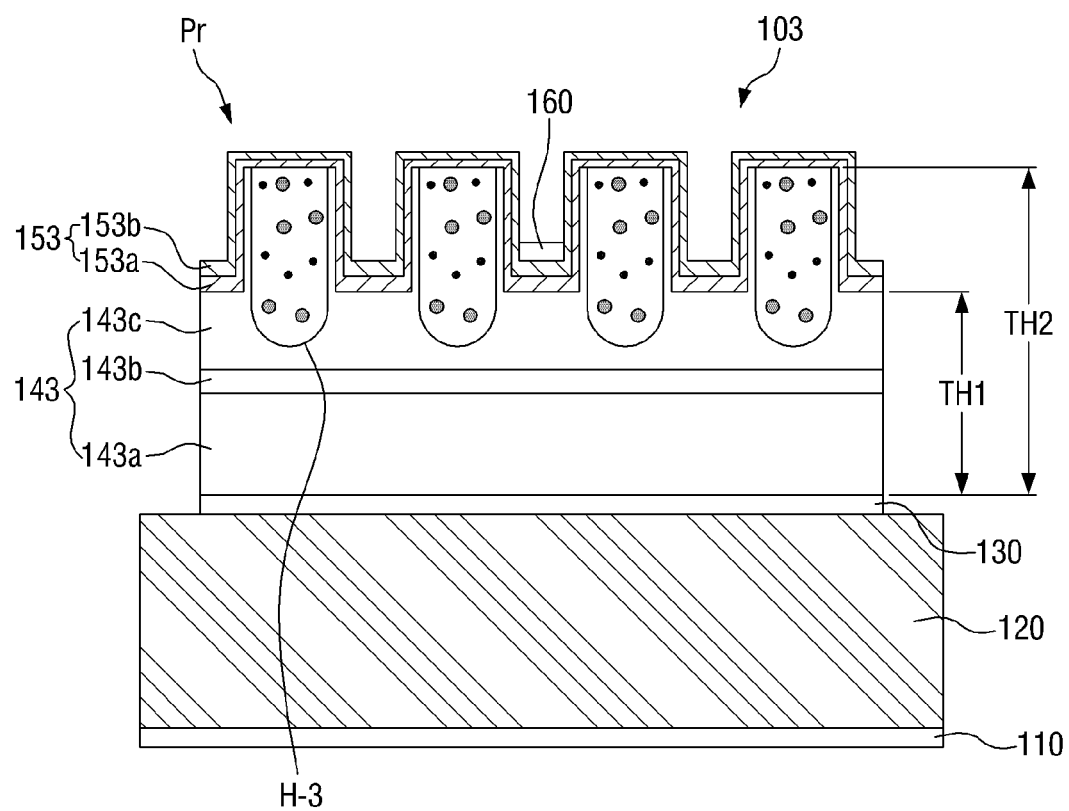
FIG. 15 is a cross-sectional view taken along line XV-XV' of FIG. 14.

FIG. 14 is a plan view of an LED 103 according to another exemplary embodiment of the invention. FIG. 15 is a cross-sectional view taken along line XV-XV' of FIG. 14. For convenience of description, elements substantially identical to those illustrated in the above-described drawings are indicated by the same reference numerals, and a detailed description thereof will be omitted.

Referring to FIGS. 14 and 15, a light emitting structure 143 may include at least one protrusion Pr. The protrusion Pr may protrude upward from a second semiconductor layer 143c. The protrusion Pr may be provided in plural. The protrusions Pr may be arranged in a matrix in a plan view. In addition, heights of the protrusions Pr may be equal.

Holes H-3 may be defined in the protrusions Pr, respectively. In addition, the holes H-3 may expose inner side surfaces of the second semiconductor layer 143c and may not expose inner side surfaces of an active layer 143b and a first semiconductor layer 143a. However, the invention is not limited thereto.

A first layer 153a and a second layer 153b of a semi-transmissive layer 153 may cover top and side surfaces of the protrusions Pr. That is, the semi-transmissive layer 153 may also protrude upward from the light emitting structure 143 to correspond to the protrusions Pr.

In the LED 103 according to the exemplary embodiment, the light emitting structure 143 may have two thicknesses. That is, the light emitting structure 143 may have a first thickness TH1 in portions without the protrusions Pr and a second thickness TH2 in portions with the holes H-3, i.e., the protrusions Pr. The second thickness TH2 is greater than the first thickness TH1 due to the protrusion portion. Thus, a resonant length of light emitted from each portion of the light emitting structure 143 can be adjusted individually. Accordingly, the LED 103 having good color reproducibility, and a reduced thickness can be obtained.

The first thickness TH1 and the second thickness TH2 will now be described in greater detail in the exemplary embodiment of FIGS. 1 and 2. Blue light is emitted from portions of the light emitting structure 143 in which the holes H-3 are not defined. Therefore, the thickness (i.e., the first thickness TH1) of these portions may be designed to be approximately 90 nm. In addition, red light and green light are emitted from portions (i.e., the protrusions Pr) of the light emitting structure 143 in which the holes H-3 are defined. Therefore, the thickness (i.e., the second thickness TH2) of these portions may be designed to be approximately 200 nm or approximately 180 nm. Accordingly, the blue light and the red light or the blue light and the green light can be made to resonate simultaneously, and the LED 103 having a further reduced thickness can be obtained.

Figure 16:
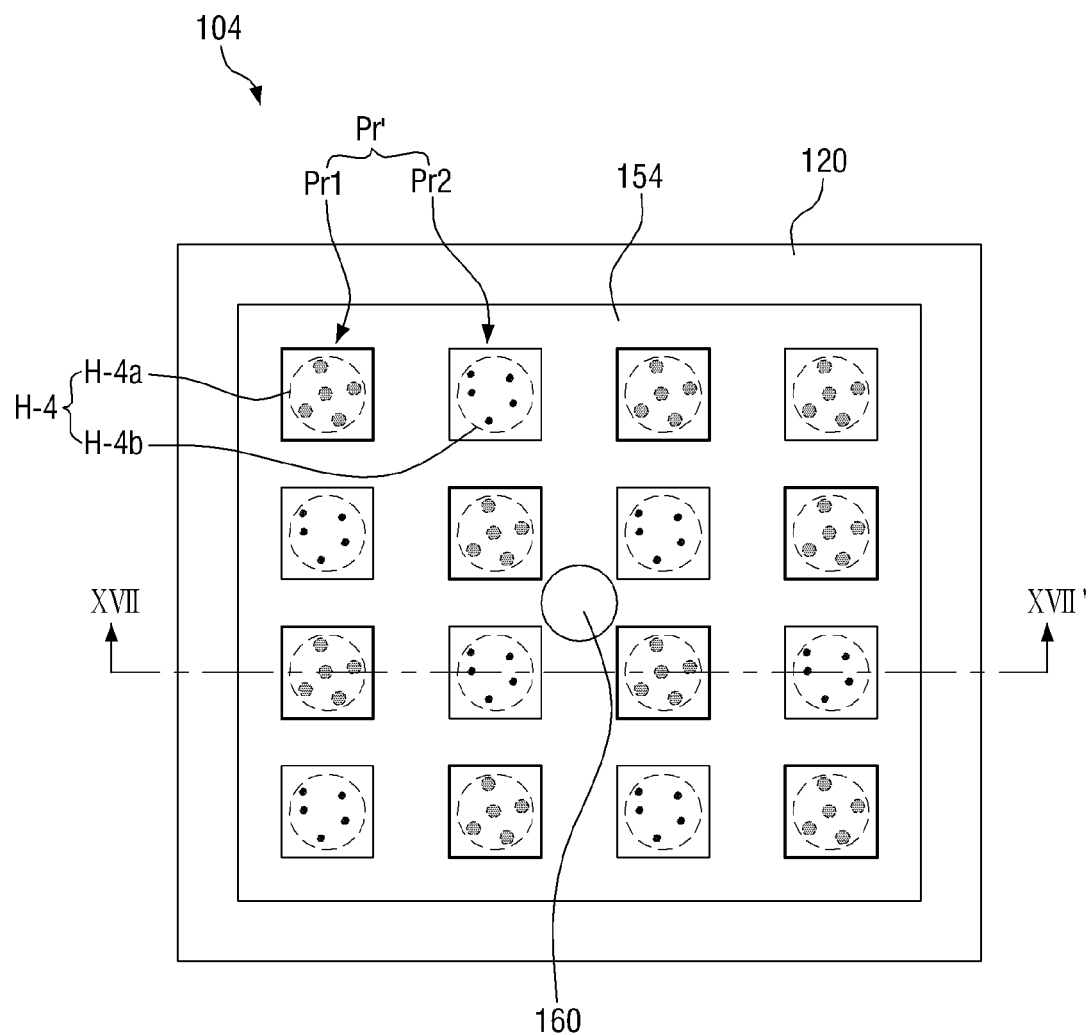
FIG. 16 is a plan view of another embodiment of an LED according to the invention.
Figure 17:
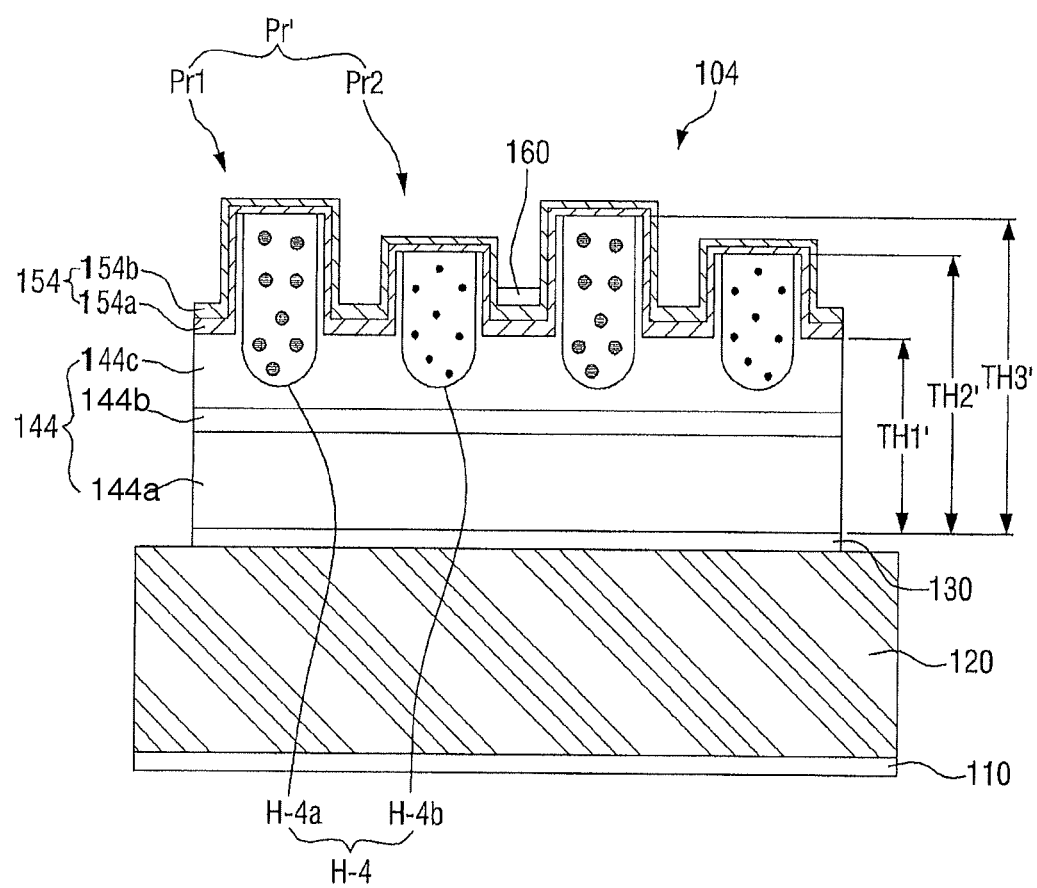
FIG. 17 is a cross-sectional view taken along line XVII-XVII' of FIG. 16.

FIG. 16 is a plan view of an LED 104 according to another exemplary embodiment of the invention. FIG. 17 is a cross-sectional view taken along line XVII-XVII' of FIG. 16. For convenience of description, elements substantially identical to those illustrated in the above-described drawings are indicated by the same reference numerals, and a detailed description thereof will be omitted.

Referring to FIGS. 16 and 17, each of a plurality of protrusions Pr' may include a first protrusion Pr1 and a second protrusion Pr2 having different heights. In an exemplary embodiment, a height of the first protrusion Pr1 may be greater than a height of the second protrusion Pr2. In addition, the first protrusion Pr1 and the second protrusion Pr2 may be arranged alternately in row and column directions in a plan view.

Each of a plurality of holes H-4 may include a first hole H-4a defined in the first protrusion Pr1 and a second hole H-4b defined in the second protrusion Pr2. In the exemplary embodiment of FIG. 17, a depth of the first hole H-4a is greater than a depth of the second hole H-4b. However, the invention is not limited thereto, and the depth of the first hole H-4a may be substantially equal to the depth of the second hole H-4b. The first hole H-4a and the second hole H-4b may expose inner side surfaces of a second semiconductor layer 144c only, and may not expose inner side surfaces of the active layer 144b and the first semiconductor layer 144a.

The first hole H-4a may be filled with a first light emitting material LM1. In addition, the second hole H-4b may be filled with a second light emitting material LM2. However, the invention is not limited thereto, and the second hole H-4b may also be filled with the first light emitting material LM1, and the first hole H-4a may also be filled with the second light emitting material LM2.

A first layer 154a and a second layer 154b of a semi-transmissive layer 154 may cover both the first protrusion Pr1 and the second protrusion Pr2.

In the LED 104 according to the exemplary embodiment, a light emitting structure 144 may have three thicknesses. That is, the light emitting structure 144 may have a first thickness TH1' in portions without the first and second protrusions Pr1 and Pr2, a second thickness TH2' in portions with the second protrusions Pr2, and a third thickness TH3' in portions with the first protrusions Pr1. Here, the thickness of the light emitting structure 144 may be increased in the order of the first thickness TH1', the second thickness TH2' and the third thickness TH3'. Thus, a resonant length of light emitted from each portion of the light emitting structure 144 can be adjusted individually. Accordingly, the LED 103 having further improved color reproducibility and a further reduced thickness can be obtained.

The first through third thicknesses TH1' through TH3' will now be described in greater detail using the exemplary embodiment of FIGS. 1 and 2. Blue light is emitted from portions of the light emitting structure 144 in which the holes H-4 are not defined. Therefore, the thickness (i.e., the first thickness TH1') of these portions may be designed to be approximately 90 nm. In addition, since green light is emitted from portions of the light emitting structure 144 in which the second protrusions Pr2 are provided, the thickness (i.e., the second thickness TH2') of these portions may be designed to be approximately 180 nm. Also, since red light is emitted from portions of the light emitting structure 144 in which the first protrusions Pr1 are provided, the thickness (i.e., the third thickness TH3') of these portions may be designed to be approximately 200 nm.

Accordingly, the blue light, the red light, and the green light can all be made to resonate simultaneously, and the LED 104 having a further reduced thickness can be obtained.

Exemplary embodiments of the invention provide at least one of the following advantages.

That is, a thin LED having high color reproducibility can be provided.

However, the effects of the invention are not restricted to the one set forth herein. The above and other effects of the invention will become more apparent to one of daily skill in the art to which the invention pertains by referencing the claims.

While the invention has been particularly shown and described with reference to exemplary embodiments thereof, it will be understood by those of ordinary skill in the art that various changes in form and details may be made therein without departing from the spirit and scope of the invention as defined by the following claims. It is therefore desired that the exemplary embodiments be considered in all respects as illustrative and not restrictive, reference being made to the appended claims rather than the foregoing description to indicate the scope of the invention.

What is claimed is:

1. A light emitting diode comprising:
a conductive substrate;
a light emitting structure which comprises:
a first semiconductor layer disposed on the conductive substrate;
an active layer disposed on the first semiconductor layer; and
a second semiconductor layer disposed on the active layer;
a semi-transmissive layer which is disposed on the light emitting structure, and
a hole which is defined in the light emitting structure and filled with a light emitting material which emits light having a color different from a color of light emitted from the active layer, the hole being entirely covered with the semi-transmissive layer.

2. The light emitting diode of claim 1, further comprising a conductive adhesive layer which is interposed between the conductive substrate and the light emitting structure and includes a reflective material.

3. The light emitting diode of claim 1, wherein the semi-transmissive layer comprises a distributed Bragg reflector layer.

4. The light emitting diode of claim 1, wherein the first semiconductor layer comprises a p-type nitride semiconductor, and the second semiconductor layer comprises an n-type nitride semiconductor.

5. The light emitting diode of claim 1, wherein the light emitting material comprises at least two types of quantum dots having different sizes.

6. The light emitting diode of claim 1, further comprising a plurality of light emitting materials which comprises a first light emitting material and a second light emitting material which emit light of different colors from each other.

7. The light emitting diode of claim 6, wherein a thickness of the light emitting structure is equal to a resonant length of at least one of light emitted from the active layer, light emitted from the first light emitting material, and light emitted from the second light emitting material.

8. The light emitting diode of claim 6, wherein the active layer emits blue light, the first light emitting material emits red light, and the second light emitting material emits green light.

9. The light emitting diode of claim 6, wherein the hole is filled with a combination of the first light emitting material and the second light emitting material.

10. The light emitting diode of claim 6, wherein a plurality of holes is defined in the light-emitting structure, and each of the plurality of holes is filled with any one of the first light emitting material and the second light emitting material.

11. The light emitting diode of claim 10, wherein the plurality of holes is arranged in a matrix in a plan view, wherein holes filled with the first light emitting material and holes filled with the second light emitting material are arranged alternately in row and column directions.

12. The light emitting diode of claim 1, further comprising:
a first electrode which is disposed directly under the conductive substrate; and
a second electrode which is disposed directly on the second semiconductor layer,
wherein the second electrode is disposed on a central portion of a surface of the second semiconductor layer, and the hole surrounds the second electrode in a plan view.

13. The light emitting diode of claim 1, wherein the light emitting structure further comprises a protrusion, and the hole is defined in the protrusion.

14. The light emitting diode of claim 13, further comprising:
a plurality of protrusions which comprises a first protrusion and a second protrusion having different heights from each other,
a plurality of holes which comprises a first hole included in the first protrusion and a second hole included in the second protrusion, and
a plurality of light emitting materials which comprises a first light emitting material and a second light emitting material which emit light of different colors from each other,
wherein the first hole is filled with any one of the first light emitting material and the second light emitting material, and the second hole is filled with the other one of the first light emitting material and the second light emitting material.

15. A light emitting diode comprising:
a reflective layer;
a light emitting structure which comprises:
a first semiconductor layer disposed on the reflective layer;
an active layer disposed on the first semiconductor layer;
a second semiconductor layer disposed on the active layer; and
a hole defined in the light emitting structure and filled with a first light emitting material and a second light emitting material; and
a Bragg reflector layer disposed on the light emitting structure,
wherein the active layer, the first light emitting material, and the second light emitting material emit light of different colors from one another.

16. The light emitting diode of claim 15, wherein a thickness of the light emitting structure is equal to a resonant length of at least one of light emitted from the active layer, light emitted from the first light emitting material, and light emitted from the second light emitting material.

17. The light emitting diode of claim 15, wherein the active layer emits blue light, the first light emitting material emits red light, and the second light emitting material emits green light.

18. A method of manufacturing a light emitting diode, the method comprising:
preparing a light emitting structure which comprises a first semiconductor layer, an active layer and a second semiconductor layer stacked sequentially on a conductive substrate;
defining a plurality of holes exposing inner side surfaces of at least one of the first semiconductor layer, the active layer and the second semiconductor layer;
filling the plurality of holes with a light emitting material; and
providing a Bragg reflector layer on the light emitting structure, the Bragg reflector layer extended to overlap an entirety of the defined holes.

19. The method of claim 18, wherein the preparing the light emitting structure comprises:
providing a preliminary light emitting structure on a sapphire substrate;
bonding the preliminary light emitting structure and the conductive substrate with a conductive adhesive layer;
exposing a surface of the preliminary light emitting structure by separating the sapphire substrate from the preliminary light emitting structure; and
converting the preliminary light emitting structure into the light emitting structure by etching the exposed surface of the preliminary light emitting structure.

20. The method of claim 18, wherein the filling the plurality of holes with the light emitting material comprises injecting at least one of a first light emitting material which emits red light and a second light emitting material which emits green light into each of the plurality of holes.

* * * * *